United States Patent
Chen et al.

(10) Patent No.: US 11,454,820 B2
(45) Date of Patent: Sep. 27, 2022

(54) MULTIFUNCTIONAL COLLIMATOR FOR CONTACT IMAGE SENSORS

(71) Applicant: Taiwan Semiconductor Manufacturing Co., Ltd., Hsin-Chu (TW)

(72) Inventors: Hsin-Yu Chen, Hsinchu (TW); Yen-Chiang Liu, Hsinchu (TW); Jiun-Jie Chiou, Hsi (TW); Jia-Syuan Li, Hsinchu (TW); You-Cheng Jhang, Hsinchu (TW); Shin-Hua Chen, Hsinchu (TW); Lavanya Sanagavarapu, Hsinchu (TW); Han-Zong Pan, Hsinchu (TW); Chun-Peng Li, Hsinchu (TW); Chia-Chun Hung, Hsinchu (TW); Ching-Hsiang Hu, Taipei (TW); Wei-Ding Wu, Zhubei (TW); Jui-Chun Weng, Taipei (TW); Ji-Hong Chiang, Changhua (TW); Hsi-Cheng Hsu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 314 days.

(21) Appl. No.: 16/656,290

(22) Filed: Oct. 17, 2019

(65) Prior Publication Data
US 2021/0116714 A1 Apr. 22, 2021

(51) Int. Cl.
*G02B 27/30* (2006.01)
*G02B 5/20* (2006.01)
(Continued)

(52) U.S. Cl.
CPC ............... *G02B 27/30* (2013.01); *G02B 5/20* (2013.01); *G02B 26/007* (2013.01);
(Continued)

(58) Field of Classification Search
CPC ........ G02B 27/30; G02B 5/20; G02B 26/007; G06K 9/00033; G06K 9/0004;
(Continued)

(56) References Cited

U.S. PATENT DOCUMENTS

2003/0128813 A1* 7/2003 Appleby ............... B29C 69/001
378/147
2005/0161589 A1* 7/2005 Kim ................... G02B 27/0944
250/216

(Continued)

FOREIGN PATENT DOCUMENTS

| TW | 201919183 A | 5/2019 |
|---|---|---|
| TW | 201939112 A | 10/2019 |
| WO | 2015025637 A1 | 2/2015 |

*Primary Examiner* — Allen L Parker
*Assistant Examiner* — David W Houston, III
(74) *Attorney, Agent, or Firm* — Duane Morris LLP

(57) ABSTRACT

Disclosed is a cost-effective method to fabricate a multi-functional collimator structure for contact image sensors to filter ambient infrared light to reduce noises. In one embodiment, an optical collimator, includes: a dielectric layer; a substrate; a plurality of via holes; and a conductive layer, wherein the dielectric layer is formed over the substrate, wherein the plurality of via holes are configured as an array along a lateral direction of a first surface of the dielectric layer, wherein each of the plurality of via holes extends through the dielectric layer and the substrate from the first surface of the dielectric layer to a second surface of the substrate in a vertical direction.

20 Claims, 12 Drawing Sheets

(51) Int. Cl.
   *G02B 26/00*   (2006.01)
   *H01L 27/146*  (2006.01)
   *H01L 31/0216* (2014.01)
   *G06V 40/13*   (2022.01)

(52) U.S. Cl.
   CPC ...... *G06V 40/1312* (2022.01); *H01L 27/1462* (2013.01); *H01L 27/14625* (2013.01); *H01L 31/02162* (2013.01); *B32B 2551/00* (2013.01); *G06V 40/1318* (2022.01)

(58) Field of Classification Search
   CPC ........... H01L 27/1462; H01L 27/14625; H01L 31/02162; B32B 2551/00
   USPC ........................................................ 257/435
   See application file for complete search history.

(56) References Cited

U.S. PATENT DOCUMENTS

| | | | |
|---|---|---|---|
| 2005/0286024 A1* | 12/2005 | Gupta | G02B 5/208 353/84 |
| 2007/0161186 A1* | 7/2007 | Ho | H01L 45/146 438/257 |
| 2010/0029027 A1* | 2/2010 | Ikuta | H01S 5/18391 372/45.011 |
| 2010/0277789 A1* | 11/2010 | Wu | G02F 3/02 977/932 |
| 2011/0315988 A1* | 12/2011 | Yu | H01L 31/145 257/52 |
| 2012/0229759 A1* | 9/2012 | Tamura | G02C 7/12 264/1.32 |
| 2017/0315110 A1 | 11/2017 | Chou | |
| 2019/0006407 A1* | 1/2019 | Uesaka | H01L 27/14627 |
| 2019/0148145 A1* | 5/2019 | Huang | H01L 21/32139 438/694 |
| 2019/0148437 A1* | 5/2019 | Cheng | H01L 27/14627 257/432 |
| 2019/0157337 A1* | 5/2019 | Lin | H01L 27/14685 |
| 2019/0305019 A1 | 10/2019 | Chen et al. | |
| 2019/0347462 A1* | 11/2019 | Tseng | G02B 27/30 |
| 2019/0348455 A1* | 11/2019 | Cheng | G01J 3/1895 |

* cited by examiner

MULTIFUNCTIONAL COLLIMATOR FOR CONTACT IMAGE SENSORS

BACKGROUND

In order to prevent noises from ambient infrared (IR) sources, a contact image sensor (CIS), e.g., a finger print sensor, typically employs a glass filter. The glass filter in such application is typically thick (e.g., 400-500 micrometers) so as to provide efficient filtering of ambient IR noises especially at high incident angles (>15 degree). This results in a bulky assembly and can increase the cost. There exists a need to develop a cost-effective method to filter ambient infrared light to reduce noises in contact image sensors.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A thick IR glass can be used to filter undesired ambient noises for a CIS sensor. This design results in a bulky structure and increases a cost of such CIS sensor. This disclosure presents various embodiments of a method for integrating a filter function to a collimator for contact image sensors to simultaneously align incident light and filter ambient noises with a compact design and low cost.

Figure 1:
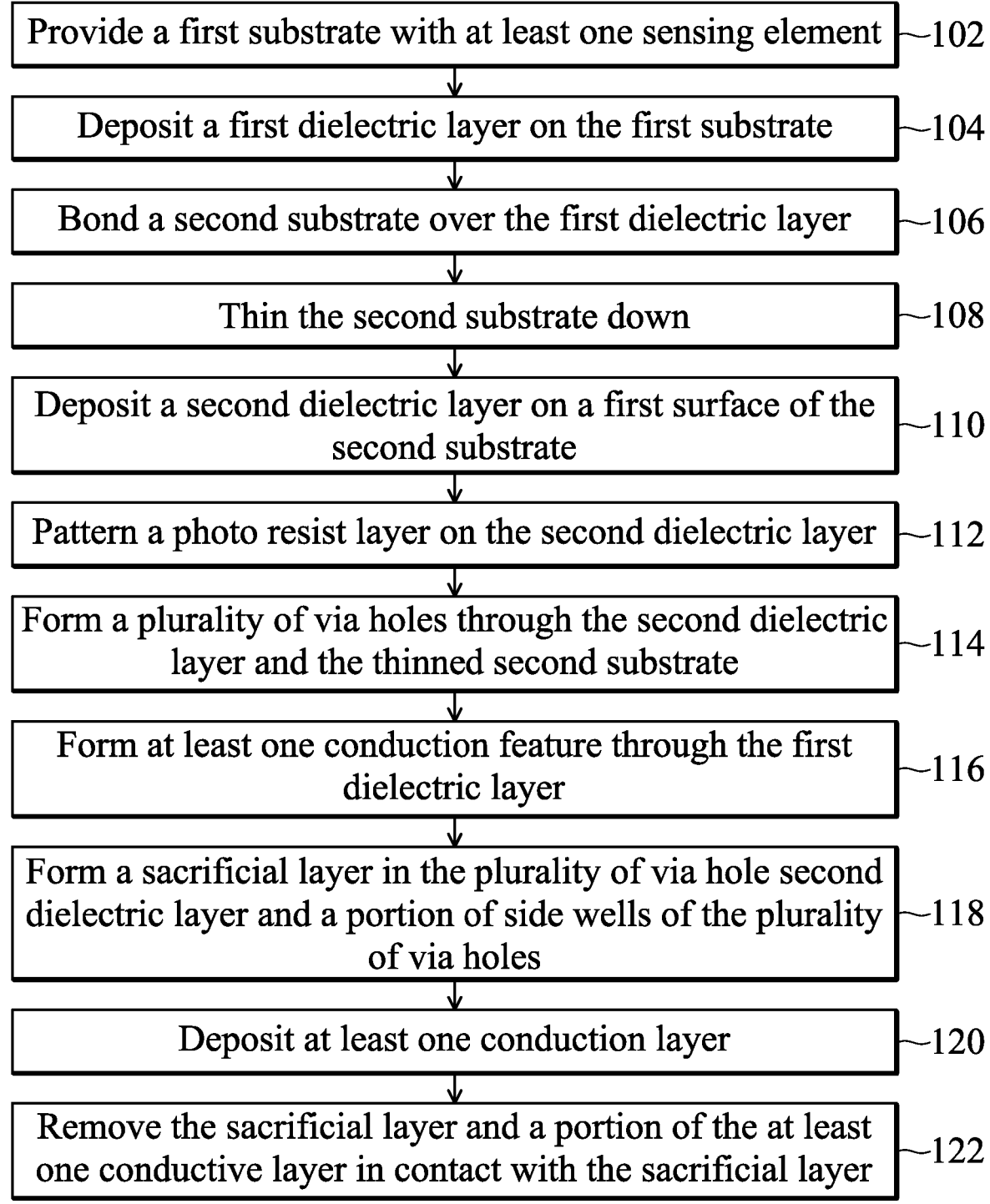
FIG. 1 illustrates a flow chart of an exemplary method for forming a semiconductor device, in accordance with some embodiments of the present disclosure.

FIG. 1 illustrates a flowchart of a method 100 to form a multifunctional collimator structure on a semiconductor device, in accordance with some embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, and 2H, 2I, respectively, which will be discussed in further detail below.

Referring now to FIG. 1, the method 100 starts with operation 102 in which a first substrate is provided according to some embodiments. In some embodiments, the first substrate comprises at least one optical sensing element. The method 100 continues with operation 104 in which a first dielectric layer is deposited on the surface of the first substrate according to some embodiments. In some embodiments, the first dielectric layer comprises silicon oxide for planarization of a CMOS backend topography and creating a Si to oxide Fu-bond surface. The method 100 continues with operation 106 in which a second substrate is bonded over the first dielectric layer on the first substrate according to some embodiments. In some embodiments, the second substrate is bonded to the first dielectric layer through a wafer bonding process. In some embodiments, the second substrate is a silicon substrate. The method 100 continues with operation 108 in which a second substrate is thinned down according to some embodiments. In some embodiments, the thinned second substrate has a thickness of 75 micrometers. The method 100 continues with operation 110 in which a second dielectric layer is deposited on a first surface of the second substrate according to some embodiments. In some embodiments, the second dielectric layer comprises silicon oxide. The method 100 continues with operation 112 in which a photoresist layer is patterned on the second dielectric layer according to some embodiments. In some embodiments, the patterned photoresist layer provides a pattern of a collimator structure.

The method 100 continues with operation 114 in which a plurality of via holes through the second dielectric layer and the thinned second substrate is formed according to some embodiments. In some embodiments, the plurality of via holes is formed by etching the second dielectric layer using the patterned first photoresist layer as a soft mask followed by etching the thinned second substrate using the patterned second dielectric layer as a hard mask. The method 100 continues with operation 116 in which at least one conductive feature is formed in the first dielectric layer according to some embodiments. In some embodiments, the at least one conductive feature provides an electrical contact to the at least one sensing element in the first substrate. The method 100 continues with operation 118 in which a second photoresist layer is formed in the plurality of via holes so as to expose a first surface of the second dielectric layer and a portion of sidewalls in the plurality of via holes according to some embodiments. In some embodiments, the second photoresist layer is coated and etched so as to expose a portion of the collimator structure. The method 100 continues with operation 120 in which at least one conductive layer is deposited according to some embodiments. In some embodiments, the at least one conductive layer each comprises a metal layer. The method 100 continues with operation 122 in which the sacrificial layer and the at least one conductive layer in contact with the sacrificial layer are removed according to some embodiments. In some embodiments, a chemical etching process is performed so as to remove the sacrificial layer and a portion of the at least one conductive layer that is in direct contact with the sacrificial layer. In some embodiments, the semiconductor with the collimator structure is then wafer diced to form a plurality of dies. In some embodiments, each of the plurality of dies is then wafer bonded to a third substrate and wire bonded. In some embodiments, each of the plurality of dies is embedded in a molding and packaged.

As mentioned above, FIGS. 2A-2H illustrate, in a cross-sectional view, a portion of a semiconductor device 200 at various fabrication stages of the method 100 of FIG. 1. The semiconductor device 200 may be included in an integrated circuit (IC). Also, FIGS. 2A-2H are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2H, for purposes of clarity of illustration.

Figure 2A:
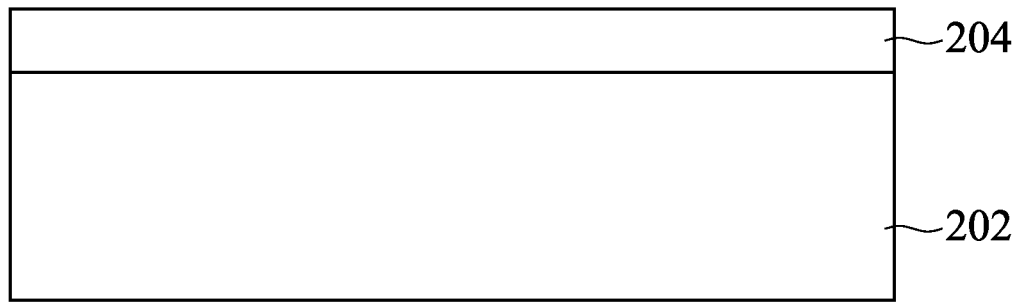
FIGS. 2A, 2B, 2C, 2D, 2E, 2F, 2G, and 2H, illustrate cross-sectional views of an exemplary semiconductor device with a collimator during various fabrication stages, made by the method of FIG. 1, in accordance with some embodiments of the present disclosure.

FIG. 2A is a cross-sectional view of the semiconductor device 200 including a first substrate 202 and a first dielectric layer 204 at one of the various stages of fabrication corresponding to operations 102 and 104 of FIG. 1, in accordance with some embodiments of the present disclosure. In some embodiments, the first substrate 202 comprises at least one optical sensing element (not shown). In some embodiments, the at least one optical sensing element each is a Contact Image Senor (CIS). In some embodiments, the CIS is an image sensor used in direct contact with the object to be imaged or scanned. In some embodiments, the CIS comprises a plurality of detectors. In some embodiments, the plurality of detectors detects light directed from an object surface. In some embodiments, the plurality of detectors each comprises one of the following: a Charge Coupled Device (CCD) sensor and a Complementary metal-oxide semiconductor (CMOS) sensor.

In some embodiments, the first substrate 202 is a silicon substrate. Alternatively, the first substrate 202 may include other elementary semiconductor material such as, for example, germanium. The first substrate 202 may also include a compound semiconductor such as silicon carbide, gallium arsenic, indium arsenide, and indium phosphide. The first substrate 202 may include an alloy semiconductor such as silicon germanium, silicon germanium carbide, gallium arsenic phosphide, and gallium indium phosphide. In one embodiment, the first substrate 202 includes an epitaxial layer. For example, the first substrate 202 may have an epitaxial layer overlying a bulk semiconductor. Furthermore, the first substrate 202 may include a semiconductor-on-insulator (SOI) structure. For example, the first substrate 202 may include a buried oxide (BOX) layer formed by a process such as separation by implanted oxygen (SIMOX) or other suitable technique, such as wafer bonding and grinding.

In some embodiments, the first substrate 202 also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a CMOS field-effect transistor (CMOS-FET), imaging sensor, and/or light emitting diode (LED). The first substrate 202 may further include other functional features such as a resistor or a capacitor formed in and on the substrate. The first substrate 202 further includes lateral isolation features provided to separate various devices formed in the first substrate 202, for example shallow trench isolation (STI). The various devices in the first substrate 202 further include silicide disposed on S/D, gate and other device features for reduced contact resistance and enhance process compatibility when coupled between devices through local interconnections.

In some embodiment, at least one conductive feature is included in the first substrate 202. In some embodiments, the at least one conductive feature can be a source, drain or gate electrode. Alternatively, the at least one conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In another embodiment, the at least one conductive feature may include an electrode of a capacitor or one end of a resistor. In another embodiment, the at least one conductive feature is a contact to the CIS sensor in the first substrate 202.

In some embodiments, the first dielectric layer 204 comprises a material that is at least one of the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the first dielectric layer 204 is deposited using plasma enhanced chemical vapor deposition (PECVD) with a silane gas as a precursor gas. In some other embodiments, the first dielectric layer 204 is deposited using a physical vapor deposition (PVD) process.

Figure 2B:
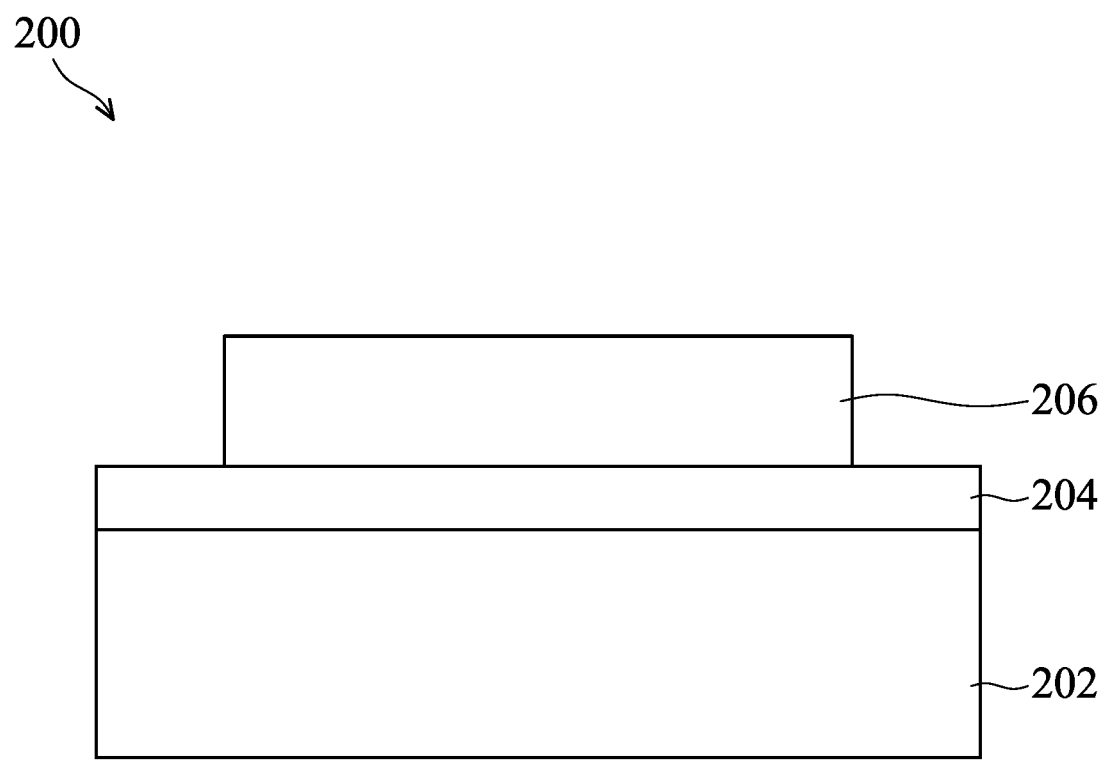

FIG. 2B is a cross-sectional view of the semiconductor device 200 including the first substrate 202, the first dielectric layer 204 and a second substrate 206 at one of the various stages of fabrication that corresponds to operation 106 of FIG. 1, in accordance with some embodiments of the present disclosure. In some embodiments, the second substrate 206 includes a silicon substrate. Alternatively, the second substrate 206 may include other elementary semiconductor material according to the optical properties of the materials, such as, for example, germanium. The second substrate 206 may also include a compound semiconductor such as silicon carbide, gallium arsenic, indium arsenide, and indium phosphide. The second substrate 206 may include an alloy semiconductor such as silicon germanium, silicon germanium carbide, gallium arsenic phosphide, and gallium indium phosphide. In one embodiment, the second substrate 206 includes an epitaxial layer. For example, the second substrate 206 may have an epitaxial layer overlying a bulk semiconductor. Furthermore, the second substrate 206 may include a semiconductor-on-insulator (SOI) structure. For example, the second substrate 206 may include a buried oxide (BOX) layer formed by a process such as separation by implanted oxygen (SIMOX) or other suitable technique, such as wafer bonding and grinding.

In some embodiments, the second substrate 206 is bonded to the first dielectric layer 204 through a wafer bonding process. In some embodiments, the wafer bonding process is a direct bonding without any additional intermediate layers. In some embodiments, the wafer bonding process comprises at least one of the following steps: surface preprocessing, pre-bonding at room temperature, and annealing at elevated temperatures. In another embodiment, surface activation can be used so as to avoid high temperature annealing.

Figure 2C:
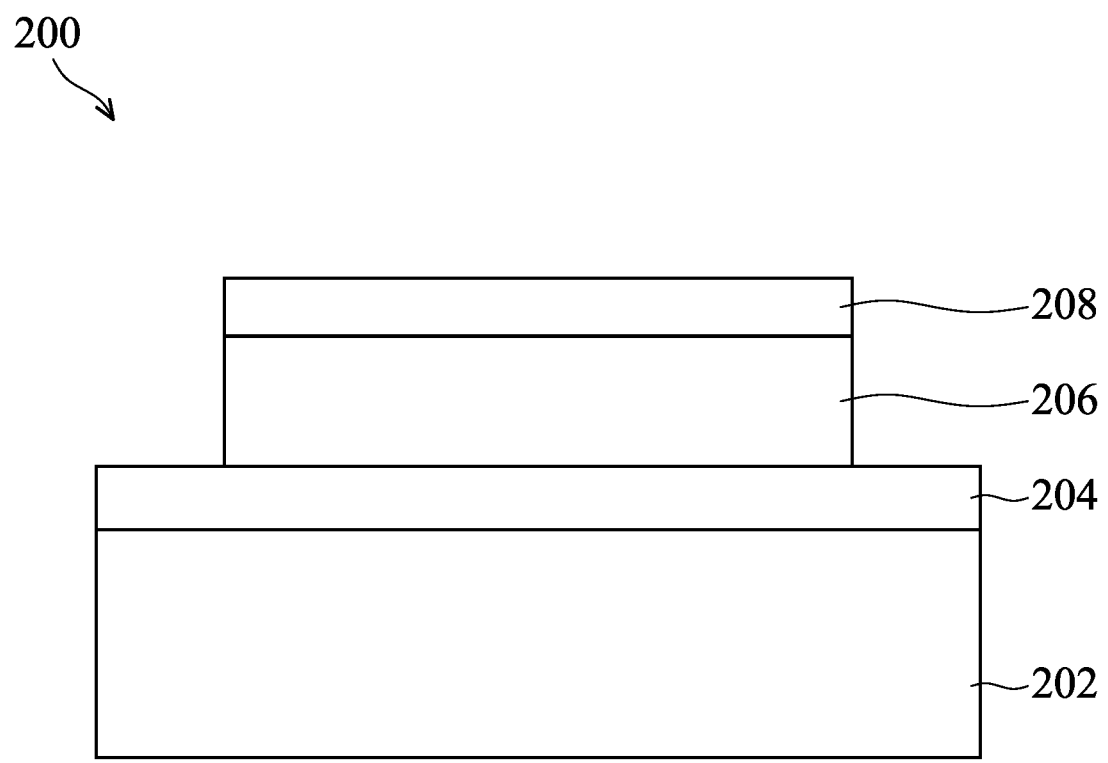

FIG. 2C is a cross-sectional view of the semiconductor device 200 including a second dielectric layer 208 over an thinned second substrate 206 at one of the various stages of fabrication that corresponds to operations 108 and 110 of FIG. 1, in accordance with some embodiments of the present disclosure. In some embodiments, the second substrate 206 after bonding to the first dielectric layer 204 on the first substrate 202 is further thinned down to obtain a desired thickness. In some embodiments, the second substrate 206 is etched by a dry and/or wet etching process. In some embodiments, the etched second substrate 206 has a thickness of 75 micrometer. In some embodiments, the second dielectric layer 208 is deposited on the etched second substrate 206. In some embodiments, the second dielectric layer 208 comprises a material that is least one of the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the second dielectric layer 208 is deposited using plasma enhanced chemical vapor deposition (PECVD) with a silane gas as a precursor gas. In some other embodiments, the second dielectric layer 208 is deposited using a physical deposition process, e.g., sputtering and evaporation. In some embodiments, the second dielectric layer 208 is deposited using an atomic layer deposition (ALD) process. In some embodiments, the second dielectric layer 208 has a thickness of at least 3,000. In some embodiments, the surface of the second substrate that is not in direct contact with the first dielectric layer 204 after etching is further planarized through a Chemical-Mechanical Polishing (CMP) process before the deposition of the second dielectric layer 208.

Figure 2D:
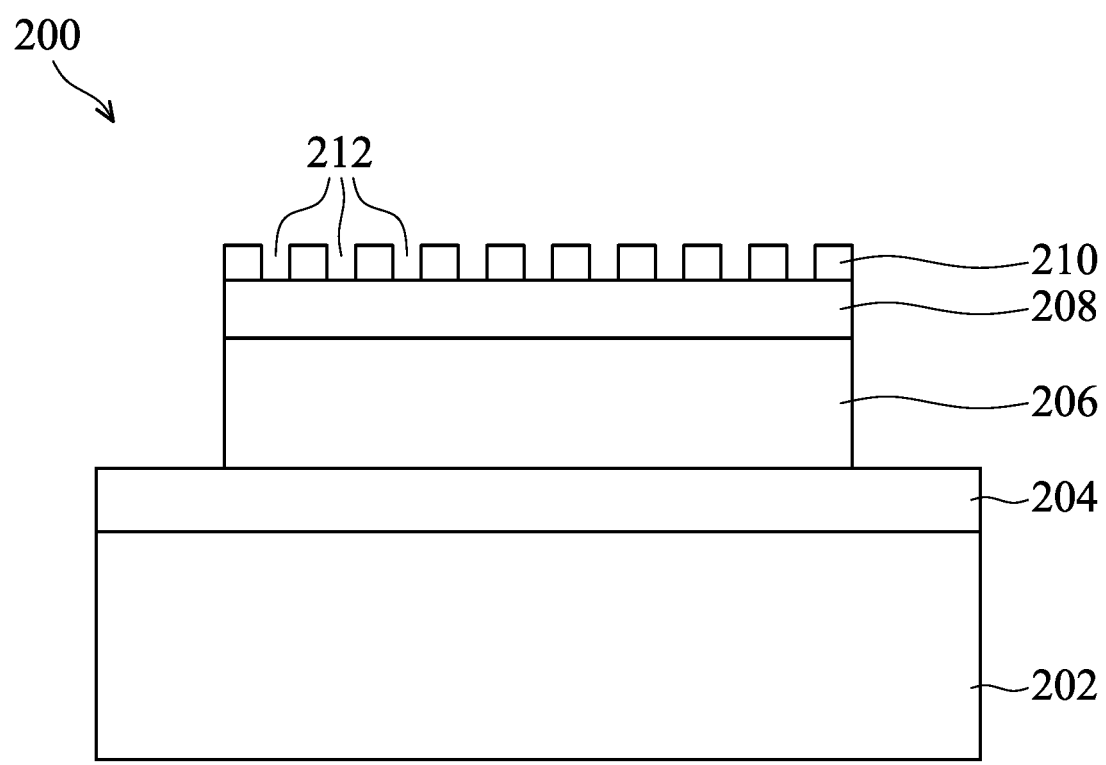

FIG. 2D is a cross-sectional view of the semiconductor device 200 in which a photoresist layer 210 is patterned on the second dielectric layer 208 at one of the various stages of fabrication that corresponds to operation 112 of FIG. 1, in accordance with some embodiments of the present disclosure. As described below, the patterned photoresist layer 210 is used to mask an etching of the second dielectric layer 208 and the thinned second substrate 206 to form a plurality of via holes (i.e., a collimator structure) on top of the first dielectric layer 204 on the first substrate 202. Accordingly, in some embodiments, the patterned photoresist layer 210 is formed after a conventional patterning (e.g., photolithography) process, to align the collimate structure with the at least one optical sensing element in the first substrate 202.

In some embodiments, an initial photoresist layer 210 before the patterning process may include a negative or positive tone photoresist layer that is patternable in response to a photolithography light source. In some alternative embodiments, the initial photoresist layer 210 may include an e-beam (electron beam) resist layer (e.g., poly methyl methacrylate, methyl methacrylate, etc.) that is patternable in response to an e-beam lithography energy source. In some embodiments, the initial photoresist layer 210 is formed over the second dielectric layer 208 using a deposition process known in the art such as spin-coating, spray-coating, dip-coating, roller-coating, or the like. The initial photoresist layer 210 is then patterned in a lithography process that may involve various exposure, developing, baking, stripping, etching, and rinsing processes. As a result, the patterned photoresist layer 210 is formed such that a plurality of openings 212 expose at least a portion of the top surface of the second dielectric layer 208, as shown in FIG. 2D. In some embodiments, the plurality of openings 212 in the patterned photoresist layer is circular and has a diameter of 4 micrometers. In some embodiments, the diameters of the plurality of openings are in a range of 1-3 micrometers, and in some embodiments the diameter is 2 micrometers.

Figure 2E:
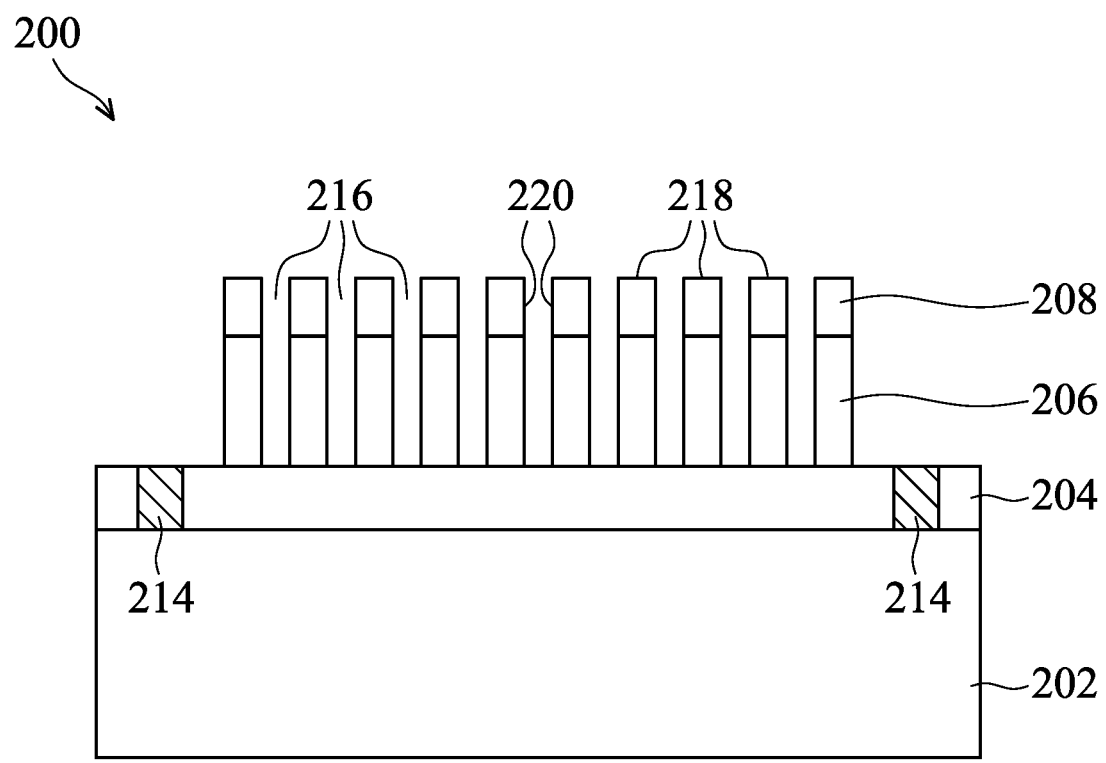

FIG. 2E is a cross-sectional view of the semiconductor device 200 in which a plurality of via holes is formed in the second dielectric layer 208 and the etched second substrate 206, the patterned photoresist layer 210 is removed and at least one conductive feature 214 is formed in the first dielectric layer 204 at one of the various stages of fabrication that corresponds to operations 114 and 116 of FIG. 1, in accordance with some embodiments of the present disclosure. In some embodiments, the second dielectric layer 208 is first etched so as to transfer the pattern in the patterned photoresist layer 210 with the plurality of openings 212 to the second dielectric layer 208. In some embodiments the patterned second dielectric layer 208 is then further etched so as to transfer the patterns in the second dielectric layer 208 to the thinned second substrate 206. In some embodiments, the etching of the second dielectric layer 208 and the second substrate 206 is performed by a dry and/or wet etching process.

In some embodiments, the patterned photoresist layer 210 is removed before the etching of the second substrate 206. In some embodiments, the patterned photoresist layer 210 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the patterned photoresist layer 210. The selection of the remover is determined by the type and chemical structure of the patterned photoresist layer 210, the second dielectric layer 208, as well as the second substrate 206 to assure the chemical compatibility of these layers with the chemical cleaning process. In some embodiments, this cleaning process is then followed by a rinsing process using isopropyl alcohol or the like, followed by rinsing using deionized water. As a result of this process, the plurality of via holes 216, i.e., the collimator structure, are formed through the second dielectric layer 208 and the second substrate 206. In some embodiments, the collimator structure comprises a top surface 216 of the second dielectric layer 208 and sidewalls 220.

In some embodiments, the at least one conductive feature 214 is formed in the first dielectric layer 204 so as to provide an electric contact to the at least one optical sensing element in the first substrate 202. In some embodiments, the conductive feature 214 is formed through a separate conventional patterning (e.g., photolithography) process, which may involve various exposure, developing, backing, stripping, etching and rinsing processes. In some embodiments, the conductive feature 214 is formed by using CVD, PVD, spin-on-coating and/or other suitable techniques to deposit conductive materials over a separately patterned photoresist layer, followed by a wet-etching of the photoresist layer. As a result, the at least one conductive feature 214 is formed in the first dielectric layer 204.

Figure 2F:
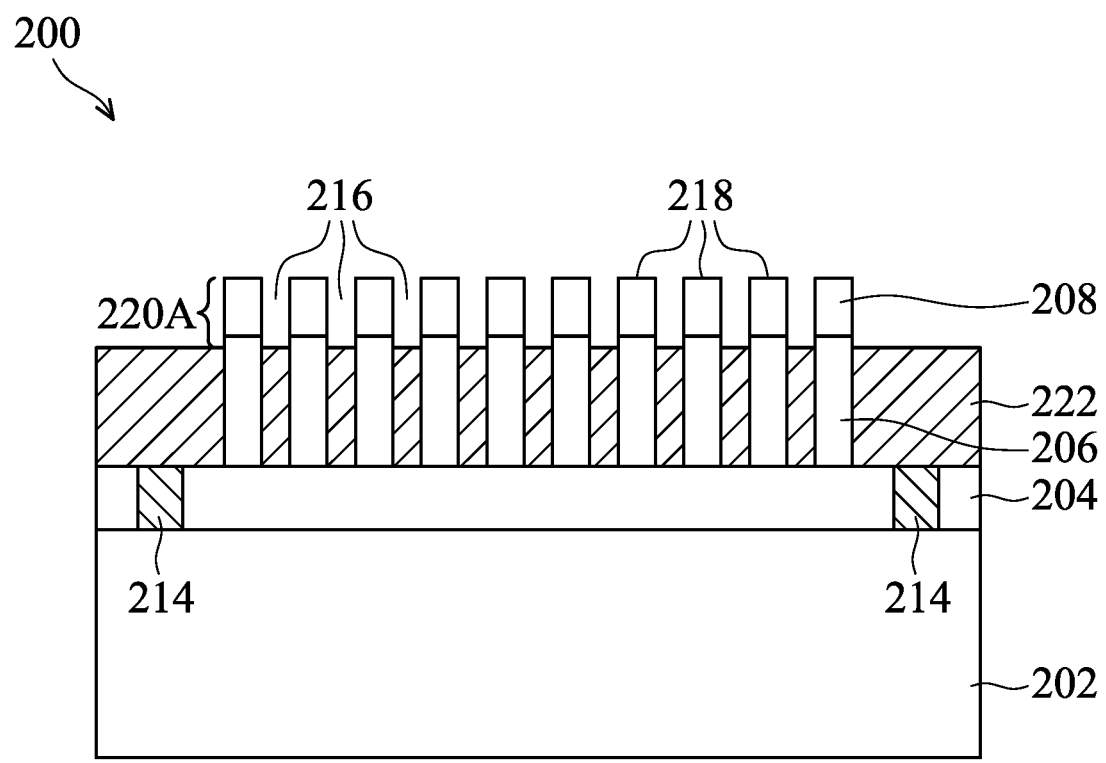

FIG. 2F is a cross-sectional view of the semiconductor device 200 in which a sacrificial layer 222 is formed in the plurality of via holes 216 and a portion of the collimator structure is expose at one of the various stages of fabrication that corresponds to operation 118 of FIG. 1, in accordance with some embodiments of the present disclosure. In some embodiments, the sacrificial layer 222 is a photoresist layer which can be formed by filling in the collimator structure with photoresists. In some embodiments, the sacrificial layer 222 can be partially removed in a dry etching process with a selectivity that allows a negligible etching to the second dielectric layer 208 and the second substrate 206. As a result, a portion of the collimator structure from its top surface can be exposed. Specifically, the top surface 218 of the second dielectric layer 208, a portion (220A) of the sidewalls 220 of the plurality of via holes 216 are exposed. In some embodiments, the depth of the exposed portion 220A of the sidewalls 220 is less than the thickness of the second dielectric layer 208. In some other embodiments, the depth of the exposed portion 220A of the sidewall 220 is greater than the thickness of the second dielectric layer 208.

Figure 2G:
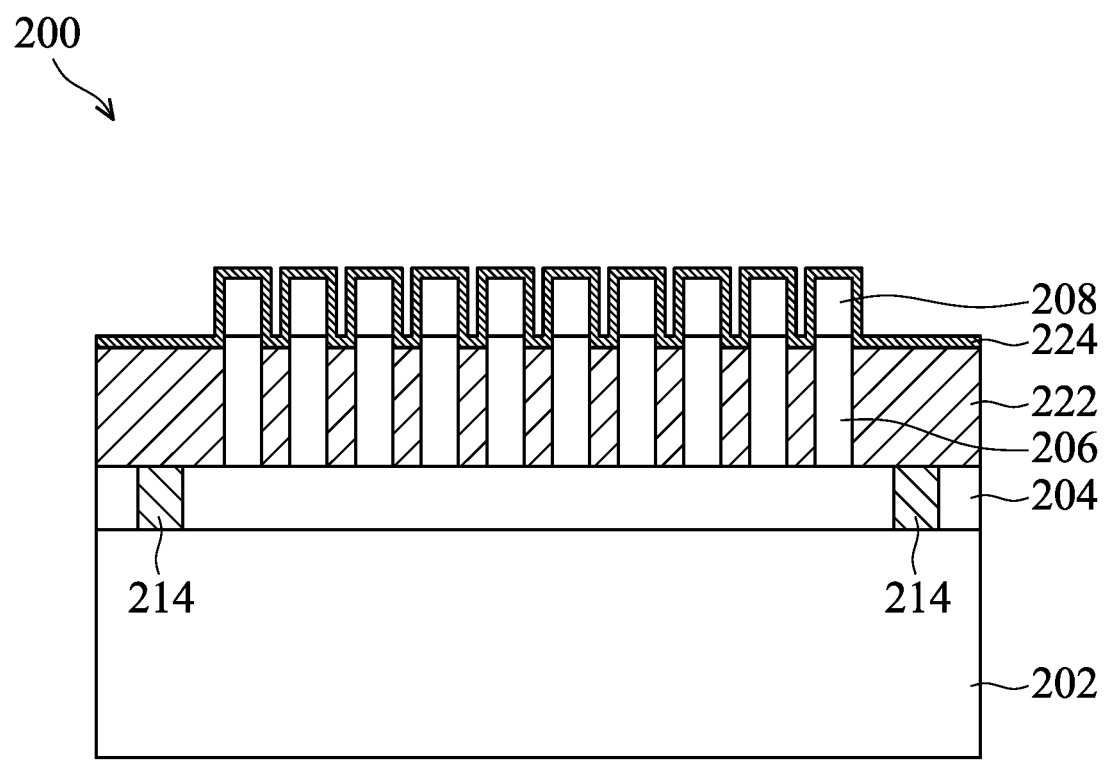

FIG. 2G is a cross-sectional view of the semiconductor device 200 in which a conductive layer 224 is deposited at one of the various stages of fabrication that corresponds to operation 120 of FIG. 1, in accordance with some embodiments of the present disclosure. In some embodiments, the conductive layer 224 is deposited using a PVD process (e.g., sputtering and evaporation). In some embodiments, the conductive layer 224 comprises a plurality of conductive layers stacked in a layer-by-layer fashion. In some embodiments, the conductive layer 224 is in direct contact with the top surface 218 and the portion 220A of the sidewalls 220 of the collimator structure. In some embodiments, the conductive layer 224 is also deposited on the surface of the sacrificial layer 218. In some embodiments, the conductive layer 224 comprises an aluminum-copper (AlCu) alloy. In some embodiments, an Al/Cu ratio is in a range of 190 to 210, and in some embodiments, the ratio is 199. In some embodiments, the Al/Cu ratio is controlled by the composition of a target. In some other embodiments, the Al/Cu ratio is determined according to deposition rates of two separate targets. In some embodiments, the thickness of the conductive layer 224 on the surface of the sacrificial layer 222 and the top surface 218 of the collimator structure is 900 nanometers. In some other embodiments, the thickness of the conductive layer 224 on the surface of the sacrificial layer 222 and the top surface 218 of the collimator structure is in a range of 8 to 12 micrometers, and in some embodiments the thickness is 10 micrometers. In some embodiments, the thickness of the conductive layer 224 on the sidewalls 220A of the collimator structure is different from that on the top surface 218 due to a difference in deposition rate on different surfaces. In some other embodiments, a conformal coating of the conductive layer 224 can be used to obtain a comparable thickness of conductive layers on the top surface 218 and the sidewalls 220A. In some embodiments, other metallic materials and alloys can be used in the conductive layer 224 according to the desired operation conditions for the CIS sensor (e.g., a wavelength range to be filtered by the collimator structure) and optical properties of materials, which are all within the scope of this invention.

Figure 2H:
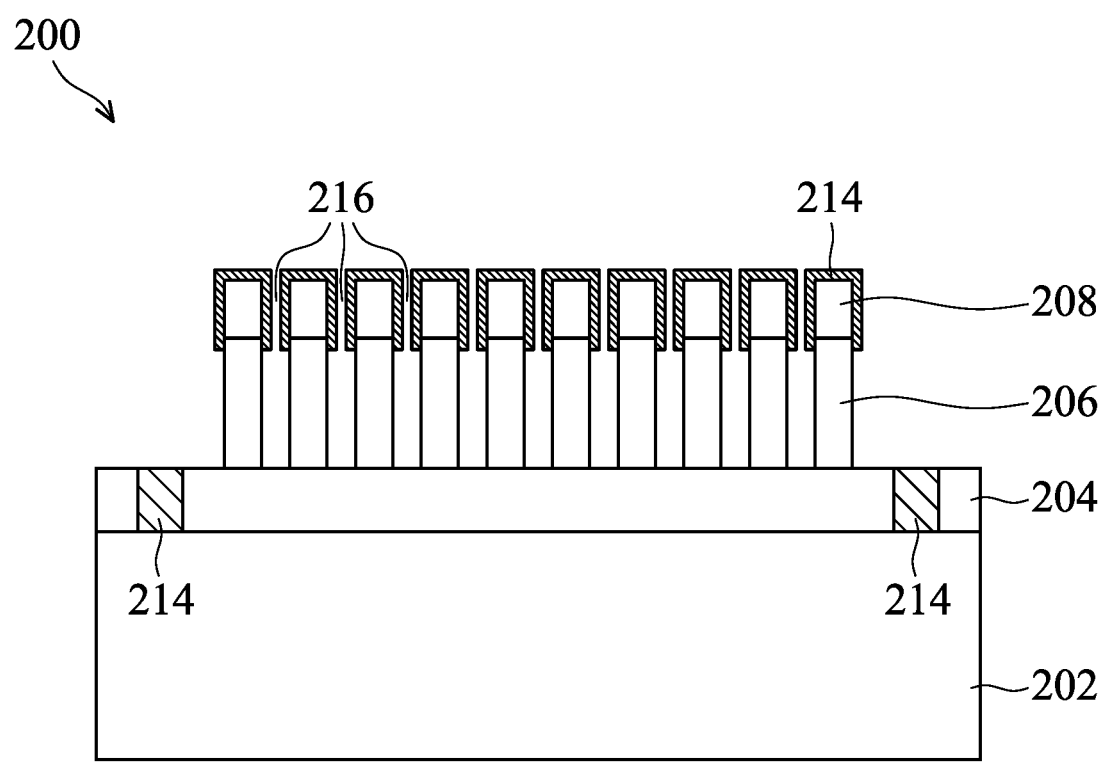

FIG. 2H is a cross-sectional view of the semiconductor device 200 in which the collimator structure is formed at one of the various stages of fabrication that corresponds to operation 122 of FIG. 1, in accordance with some embodiments of the present disclosure. In some embodiments, the sacrificial layer 222 is removed by one or more chemical cleaning processes using suitable chemicals. For example, when the sacrificial layer 222 is a photoresist layer, the sacrificial layer 222 can be removed by acetone, 1-Methyl-2-pyrrolidon (NMP), and Dimethyl sulfoxide (DMSO). In some embodiments, the chemicals used may need to be heated to temperatures higher than room temperature to effectively dissolve the sacrificial layer 222. The selection of the remover is determined by the type and chemical structure of the conductive layer 224, the second dielectric layer 208, as well as the second substrate 206 to assure the chemical compatibility of these layers with the chemical cleaning process. In some embodiments, this cleaning process is then followed by a rinsing process using isopropyl alcohol or the like, followed by rinsing using deionized water. As a result, the conductive layer 224 that are in direct contact with the sacrificial layer 222 is removed.

In some embodiments, the collimator structure narrows incident light and allow the incident light to be aligned in a specific direction when the light arrives at the at least one optical sensing element in the first substrate. Furthermore, the collimator structure with the conductive layer 224 further allows to filter undesired ambient noises and prevent these noises from reaching at the at least one optical sensing element. Therefore, the conductive-layer-coated collimator structure in the present disclosure provides multiple functions allowing the use of regular glass during packaging and thus reducing the cost, and further allowing the use of CIS devices in space-limited applications.

Figure 3:
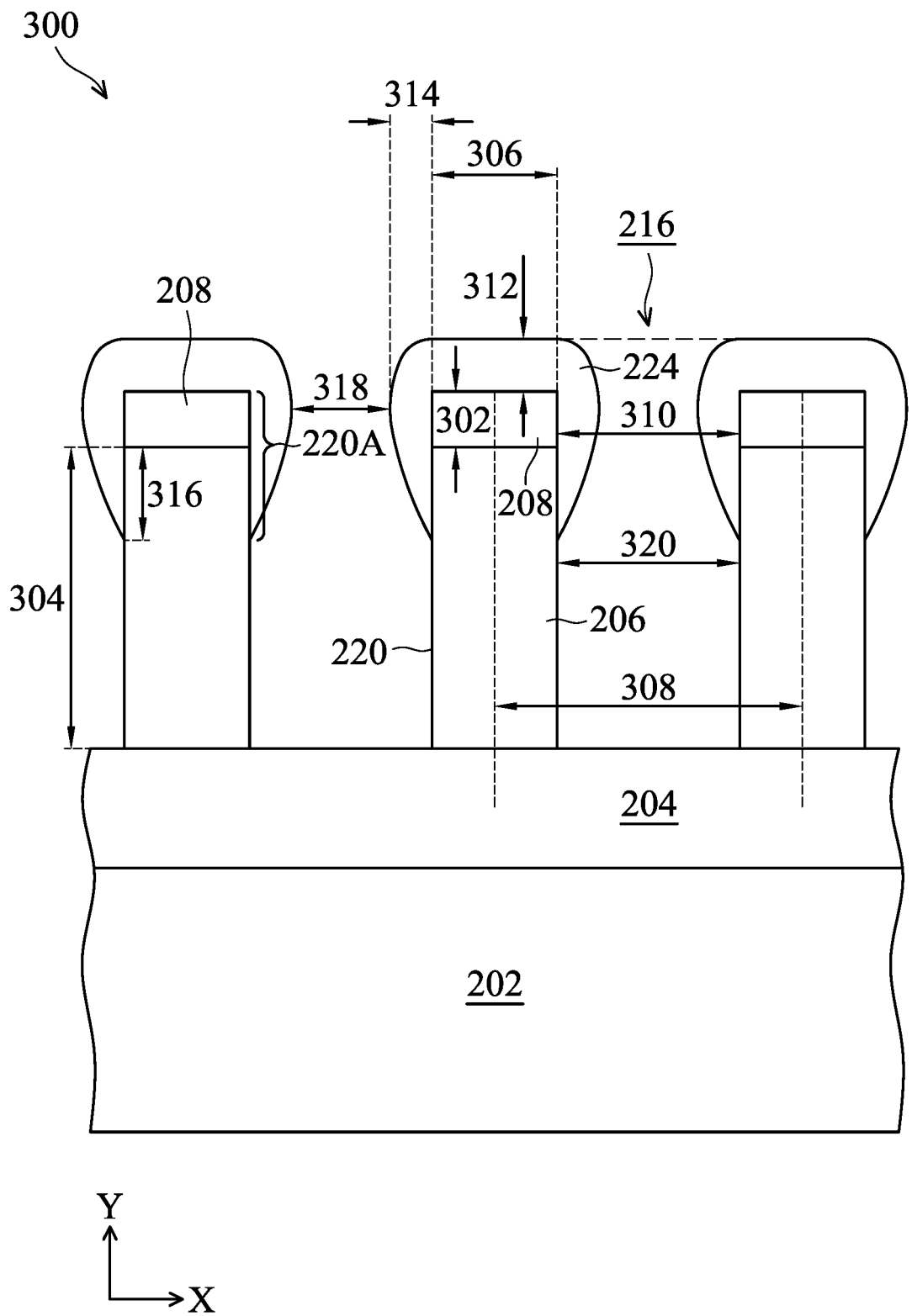
FIG. 3 illustrates an exemplary cross-sectional views of a semiconductor device with a collimator, in accordance with some embodiments of the present disclosure.

FIG. 3 illustrates an exemplary cross-sectional view of a semiconductor device 300 with a collimator structure, in accordance with some embodiments of the present disclosure. In the illustrated embodiment, the collimator structure is fabricated according to the method 100 described in FIG. 1. Specifically, the device 300 comprises a first substrate 202, a first semiconductor layer 204, a plurality of via holes in a second substrate 206 and a second dielectric layer 208, and a conductive layer 224. In the illustrated embodiments, the conductive layer 224 is deposited on a first surface 218 of the second dielectric layer 208 and also on a portion of sidewalls 220A of the plurality of via holes.

In some embodiments, the patterned second dielectric layer 208 has a thickness 302 in a range of 0.8 to 1.2 micrometers, and in some embodiments is 1.0 micrometers. In some embodiments, the patterned second substrate 206 has a thickness 304 in a range of 4 to 8 micrometers, and in some embodiments is 6 micrometers. In some embodiments, the patterned second dielectric layer 208 has a thickness 306 in a range of 0.8 to 1.2 micrometers, and in some embodiments is 1.0 micrometers.

In some embodiments, a pitch size 308 is in a range of 0.5 to 1.0 micrometers, and in some embodiments is 0.8 micrometers. In some embodiments, a diameter of an opening 216 before the deposition of the conductive layer 224 is in a range of 0.03 to 0.08 micrometers, and in some embodiments is 0.05 micrometers. In some embodiments, a first thickness 312 of the conductive layer 224 in the y direction on the first surface 208 is in a range of 180 to 220 nanometers, and in some embodiments is 200 nanometers. In some embodiments, a second thickness 314 of the conductive layer in the x direction on the sidewalls 220A of the collimator structure is in a range of 15 to 25 nanometers, and in some embodiments is 20 nanometers. In some embodiments, the conductive layer 224 is deposited on the sidewalls of the second substrate 206 with a depth in a range of 2500 to 3500 nanometers, and in some embodiments the depth is 3000 nanometers.

In the illustrated embodiment, the sidewalls 220 of the plurality of via holes 216 etched into the second dielectric layer 208 and the second substrate 206 are perpendicular to the exposed surface of the first dielectric layer 204. This profile obtained under ideal etching conditions with idea sidewalls passivation in the device 300 is for illustration purposes and not intend to be limiting. Practical etching conditions (i.e., etching rate in different directions) can cause effects such as tapering, undercutting, notching, bowing, rippling, etc., which alter the sidewall profile of the openings 216. It should be noted that different sidewall profiles that can be obtained from practical etching conditions are all within the scope of this invention.

Figure 4:
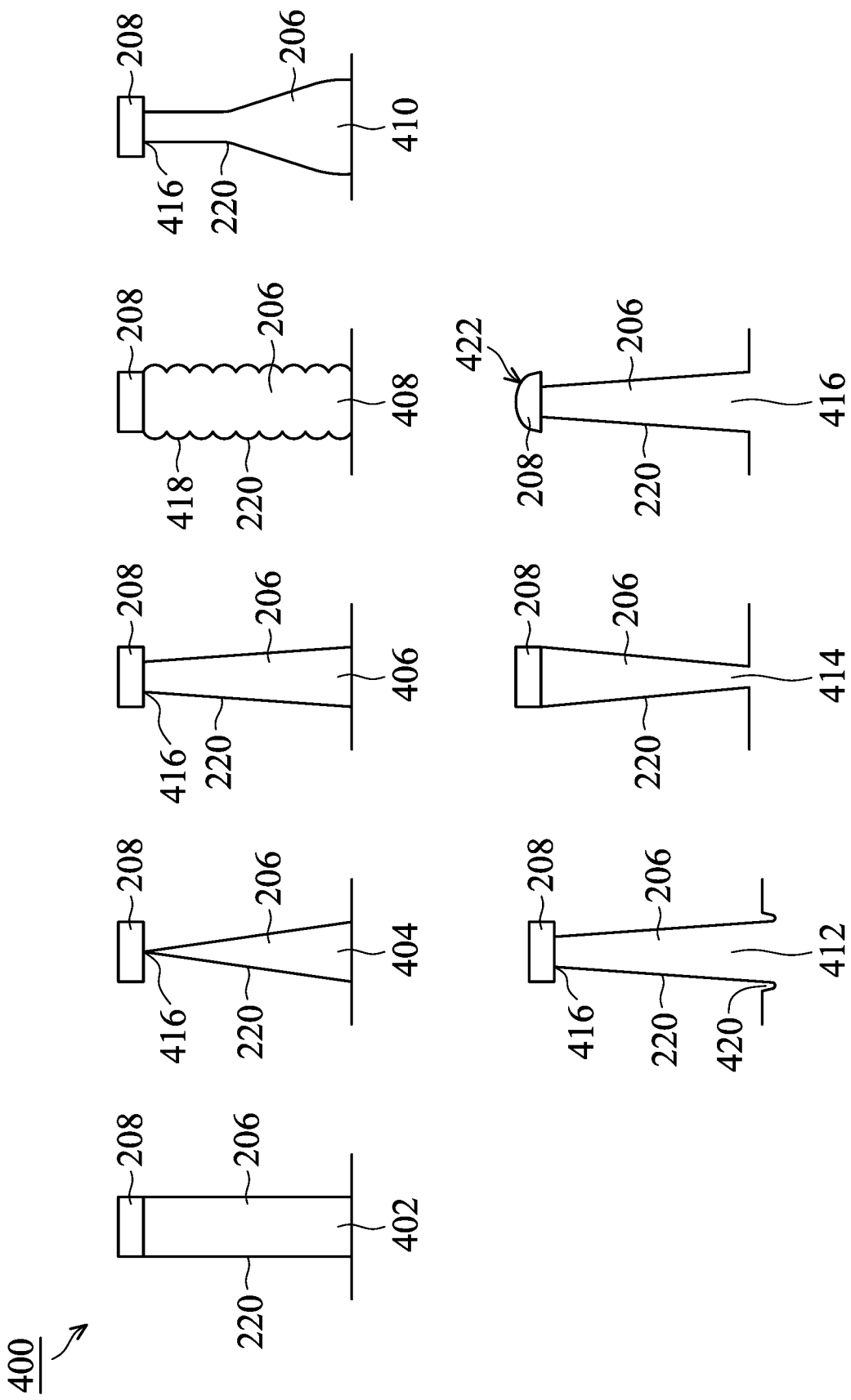
FIG. 4 illustrates exemplary cross-sectional views of sidewall profiles of etched openings in a collimator structure, in accordance with some embodiments of the present disclosure.

FIG. 4 illustrates various sidewall profiles 400 of a via hole etched in the second dielectric layer 208 and the second substrate 206, in accordance with some embodiments of the present disclosure. The various sidewall profiles 400 comprises a first profile 402 with vertical sidewalls 220 from an ideal etching condition, a second profile 404 with tapered sidewalls 220 and complete undercuts 416 under the second dielectric layer 208 caused by a strong sidewall passivation, a third profile 406 with tapered sidewalls 220 and partial undercuts 416 under the second dielectric layer 208 caused by a spontaneous etching reaction, a fourth profile 408 with sidewalls 220 comprising ripples 418, a fifth profile 410 with smoothly curved sidewalls 220, a sixth profile 412 with tapered sidewalls 220 and notches 420 at the bottom of the via hole caused by distorted ion trajectories and/or chemical etching, a seventh profile 414 with inverted tapering sidewalls 220, and an eighth profile 416 with tapered sidewalls 220 and eroded corners 422 in the second dielectric layer 206. It should be noted that sidewall profiles in the FIG. 4 is for illustration purposes and not intended to be limiting. Different sidewall profiles that can be obtained from various etching conditions are all within the scope of this invention.

Referring back to FIG. 3 again, in the illustrated embodiment, the conductive layer 224 has a Q-tip cross-sectional profile, wherein the Q-tip cross-sectional profile is caused by directionality of the technique used for the deposition of the conductive layer 224. For example, as illustrated in FIG. 3, a first width 318 between two adjacent surfaces of the conductive layer 224 is smaller than a second width 320 between the two adjacent surfaces of the conductive layer 224. For example, a sputtering deposition is directional causing a primary deposition on surfaces that are facing the direction of the ion flux from a sputtering target. For another example, for techniques that are directional, the conductive layer 224 can be only deposited on top of the second dielectric layer 206 with negligible deposition on the sidewalls 220 of the via holes 216. For another example, an evaporation deposition is relatively less directional compared to the sputtering deposition process, which results in a more uniform deposition of the conductive layer 224 on the sidewalls 220 of the via holes 216. Different profiles of the conductive layer 224 on the top surface and different profiles of the sidewalls 220 of the via holes 216 can be combined and used, which are within the scope of this invention.

Figure 5A:
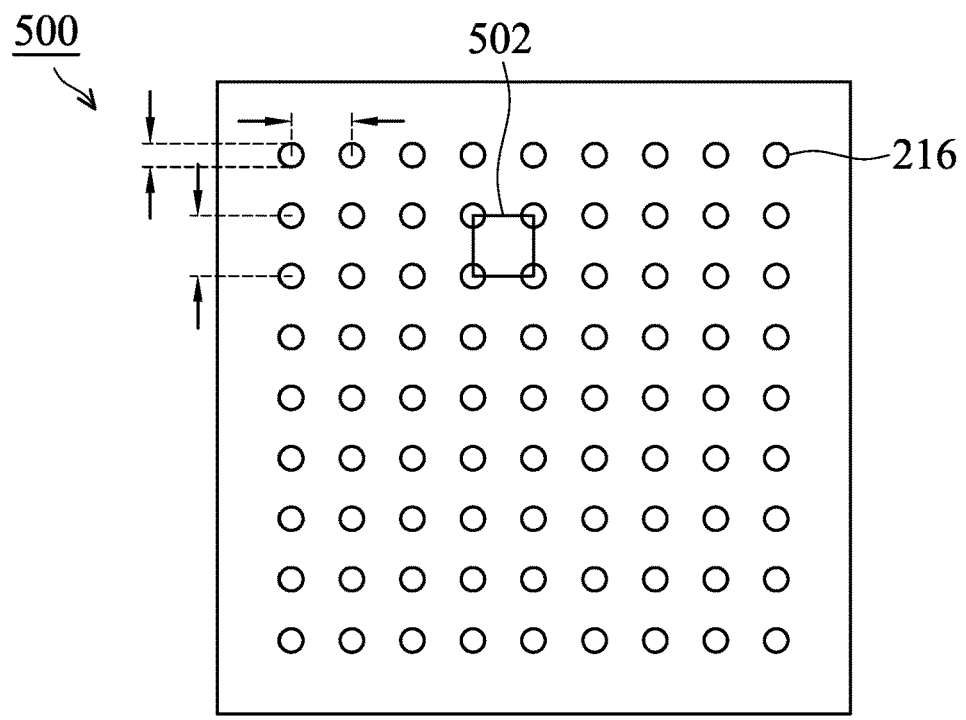
FIG. 5A illustrates an exemplary top view of a semiconductor device with a collimator, in accordance with some embodiments of the present disclosure.

FIG. 5A illustrates an exemplary top view of a semiconductor device 500 with a collimator structure, in accordance with some embodiments of the present disclosure. The collimator structure in the device 500 comprises 81 via holes 216. In the illustrated embodiments, the via holes 216 each has a circular cross section. In some other embodiments, different shapes (e.g., square) of cross sections of the via holes 216 can be used and are within the scope of this invention. In the illustrated embodiments, the via holes 216 are arranged in a 9×9 array with a square unit cell 502. It should be noted the device 500 in FIG. 5A is for illustration purposes, any numbers of via holes 216 can be used and is within the scope of this invention.

Figure 5B:
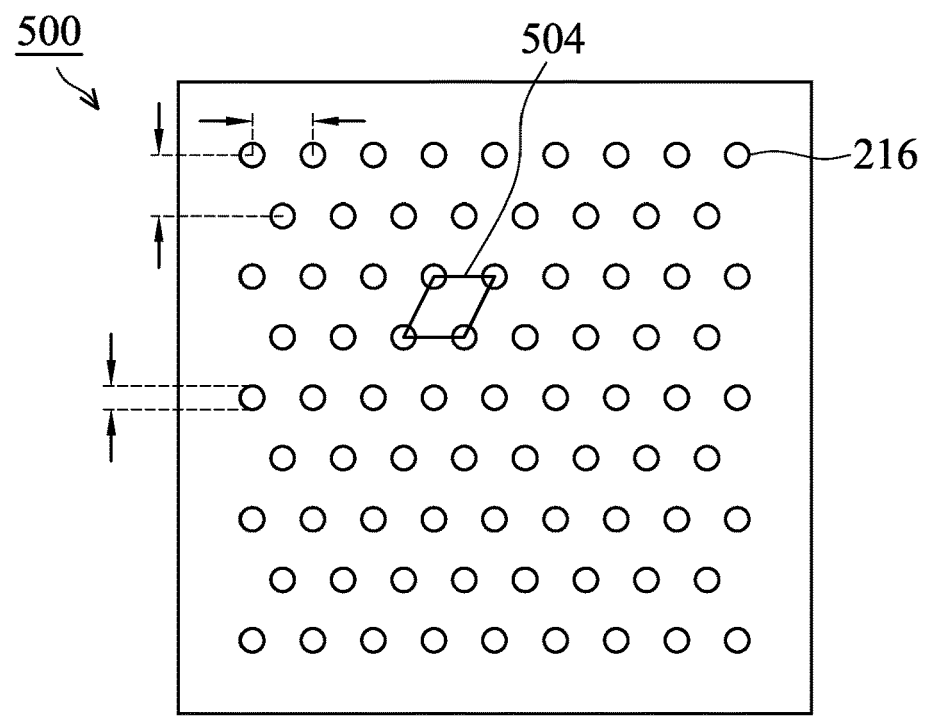
FIG. 5B illustrates an exemplary top view of a semiconductor device with a collimator, in accordance with some embodiments of the present disclosure.

FIG. 5B illustrates an exemplary top view of a semiconductor device 500 with a collimator structure, in accordance with some embodiments of the present disclosure. The collimator structure in the device 500 comprises 77 via holes 216. In the illustrated embodiments, the via holes 216 each has a circular cross section. In some other embodiments, different shapes (e.g., square) of cross sections of the via holes 216 can be used and are within the scope of this invention. In the illustrated embodiments, the via holes 216 are arranged in an array with a diamond unit cell 504. It should be noted the device 500 in FIG. 5A is for illustration purposes, any numbers of via holes 216 can be used and is within the scope of this invention.

In one embodiment, an optical collimator, includes: a dielectric layer; a substrate; a plurality of via holes; and a conductive layer, wherein the dielectric layer is formed over the substrate, wherein the plurality of via holes are configured as an array along a lateral direction of a first surface of the dielectric layer, wherein each of the plurality of via holes extends through the dielectric layer and the substrate from the first surface of the dielectric layer to a second surface of the substrate in a vertical direction, and wherein the conductive layer is formed over at least one of the following: the first surface of the first dielectric layer and a portion of sidewalls of each of the plurality of via holes, and wherein the conductive layer is configured so as to allow the optical collimator to filter light in a range of wavelengths:

In another embodiment, semiconductor device, includes: at least one optical sensing element; and an optical collimator; wherein the optical collimator comprises: a first dielectric layer, a first substrate, a plurality of via holes, and a conductive layer, wherein the first dielectric layer is formed over the first substrate, wherein the plurality of via holes are configured as an array along a lateral direction of a first surface of the first dielectric layer, wherein each of the plurality of via holes extends through the first dielectric layer and the first substrate from the first surface of the first dielectric layer to a second surface of the first substrate in a vertical direction, wherein the conductive layer is formed over at least one of the following: the first surface of the first dielectric layer and a portion of sidewalls of each of the plurality of via holes, and wherein the conductive layer is formed so as to allow the optical collimator to filter light in a range of wavelengths.

Yet, in another embodiment, a method for forming a semiconductor device, includes: forming a collimator structure on a first substrate with a first dielectric layer, wherein the collimator structure comprises a plurality of via holes, wherein each of the plurality of via holes extends through a second dielectric layer and a second substrate from a first surface of the second dielectric layer to a second surface of the second substrate in a vertical direction; and forming a conductive layer over at least one of the following: the first surface of the second dielectric layer and a portion of sidewalls of each of the plurality of via holes of the collimator structure.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

As used herein, the term "approximately" means in the range of plus or minus 10% of the stated value.

What is claimed is:

1. An optical collimator, comprising:
    a dielectric layer;
    a substrate;
    a plurality of via holes; and
    a conductive layer,
    wherein the dielectric layer is formed over the substrate, wherein the plurality of via holes are configured as an array along a lateral direction of a first surface of the dielectric layer, wherein each of the plurality of via holes extends through the dielectric layer and the substrate from the first surface of the dielectric layer to a second surface of the substrate in a vertical direction, and
    wherein the conductive layer is formed over at least one of the following: the first surface of the first dielectric layer and a portion of sidewalls of each of the plurality of via holes, and wherein the conductive layer is configured so as to allow the optical collimator to filter light in a range of wavelengths,
    wherein a first thickness of the dielectric layer is approximately 1.0 micrometer and a second thickness of the substrate is approximately 6 micrometers.

2. The optical collimator of claim 1, wherein the conductive layer comprises aluminum copper (AlCu) alloy.

3. The optical collimator of claim 1, wherein the conductive layer is formed over both the first surface of the first dielectric layer and the portion of sidewalls of each of the plurality of via holes, and wherein a first thickness of the conductive layer over the first surface of the first dielectric layer is approximately 20 nanometers and a second thickness of the conductive layer over the sidewalls of each of the plurality of via holes is approximately 2 nanometers.

4. The collimator of claim 1, wherein the conductive layer is formed over the portion of sidewalls of each of the plurality of via holes, and wherein a depth of the portion of sidewalls with the conductive layer is approximately 3,000 nanometers, wherein the first depth is measured from the first surface of the dielectric layer.

5. The collimator of claim 1, wherein each of the plurality of via holes has a dimension of approximately 0.05 micrometers.

6. The collimator of claim 1, wherein the substrate is a silicon substrate.

7. The collimator of claim 1, wherein the first range of wavelengths is between 780 and 1400 nanometers.

8. A semiconductor device, comprising:
    at least one optical sensing element; and
    an optical collimator;
    wherein the optical collimator comprises: a first dielectric layer, a first substrate, a plurality of via holes, and a conductive layer, wherein the first dielectric layer is formed over the first substrate, wherein the plurality of via holes are configured as an array along a lateral direction of a first surface of the first dielectric layer, wherein each of the plurality of via holes extends through the first dielectric layer and the first substrate from the first surface of the first dielectric layer to a second surface of the first substrate in a vertical direction,
    wherein the conductive layer is formed over at least one of the following: the first surface of the first dielectric layer and a portion of sidewalls of each of the plurality of via holes, and wherein the conductive layer is formed so as to allow the optical collimator to filter light in a range of wavelengths,
    wherein a first thickness of the dielectric layer is approximately 1.0 micrometer and a second thickness of the substrate is approximately 6 micrometers.

9. The semiconductor device of claim 8, wherein the at least one optical sensing element is formed in a second substrate, wherein the second substrate is further coated with a second dielectric layer, and wherein the optical collimator is formed over the second dielectric layer.

10. The semiconductor device of claim 8, wherein the conductive layer comprises aluminum copper (AlCu) alloy.

11. The semiconductor device of claim 8, wherein the conductive layer is formed over both the first surface of the first dielectric layer and the portion of sidewalls of each of the plurality of via holes, and wherein a first thickness of the conductive layer over the first surface of the first dielectric layer is approximately 20 nanometers and a second thickness of the conductive layer over the sidewalls of each of the plurality of via holes is approximately 2 nanometers.

12. The semiconductor device of claim 8, wherein the conductive layer is formed over the portion of sidewalls of each of the plurality of via holes, and wherein a first depth of the portion of side walls with the conductive layer is approximately 2 nanometers, wherein the first depth is measured from the first surface of the first dielectric layer.

13. The semiconductor device of claim 8, wherein each of the plurality of via holes has a dimension of approximately 0.05 micrometers.

14. The semiconductor device of claim 8, wherein the first substrate is a silicon substrate.

15. The semiconductor device of claim 8, wherein the range of wavelengths is between 780 and 1400 nanometers.

16. A method for forming a semiconductor device, comprising:
    forming a collimator structure on a first substrate with a first dielectric layer, wherein the collimator structure comprises a plurality of via holes, wherein each of the plurality of via holes extends through a second dielectric layer and a second substrate from a first surface of the second dielectric layer to a second surface of the second substrate in a vertical direction; and
    forming a conductive layer over at least one of the following: the first surface of the second dielectric layer and a portion of sidewalls of each of the plurality of via holes of the collimator structure,
    wherein a first thickness of the first dielectric layer is approximately 1.0 micrometer and a second thickness of the first substrate is approximately 6 micrometers.

17. The method of claim 16, wherein the conductive layer comprises aluminum copper (AlCu) alloy.

18. The method of claim 16, wherein the conductive layer is formed over both the first surface of the first dielectric layer and the portion of sidewalls of each of the plurality of via holes, and wherein a first thickness of the conductive layer over the first surface of the first dielectric layer is approximately 20 nanometers and a second thickness of the conductive layer over the portion of sidewalls of each of the plurality of via holes is approximately 2 nanometers.

19. The method of claim 16, wherein the conductive layer is formed over the portion of sidewalls of each of the plurality of via holes, and wherein a first depth of the portion of side walls with the conductive layer is approximately 3000 nanometers, wherein the first depth is measured from the first surface of the first dielectric layer.

20. The method of claim 16, wherein each of the plurality of via holes has a dimension of approximately 0.05 micrometers.

\* \* \* \* \*